United States Patent [19]

Yamaguchi et al.

[11] Patent Number: 5,057,400

[45] Date of Patent: Oct. 15, 1991

[54] METHOD OF FORMING PHOTOSETTING FILM

[75] Inventors: Tatsuo Yamaguchi, Hino; Hiroyoshi Ohmika; Yutaka Ohtsuki, both of Yokohama, all of Japan

[73] Assignee: Nippon Petrochemical Co., Ltd., Tokyo, Japan

[21] Appl. No.: 387,215

[22] Filed: Jul. 28, 1989

[30] Foreign Application Priority Data

Jul. 30, 1988 [JP] Japan .................................. 63-189596

[51] Int. Cl.$^5$ .............................................. G03F 7/30
[52] U.S. Cl. ..................... 430/314; 430/270; 430/277; 430/311; 430/318; 430/325; 430/329; 525/285
[58] Field of Search ............... 430/285, 313, 318, 277, 430/281, 287, 314, 311, 910, 325, 329; 525/285; 522/149

[56] References Cited

U.S. PATENT DOCUMENTS

| | | | |
|---|---|---|---|
| 3,840,390 | 10/1974 | Kozu et al. ........................ | 522/149 |
| 3,952,023 | 4/1976 | Kaiya et al. ........................ | 525/285 |
| 4,023,973 | 5/1977 | Imaizumi et al. ................... | 430/910 |
| 4,033,840 | 7/1977 | Fujiwara et al. ................... | 522/149 |
| 4,382,128 | 5/1983 | Li ....................................... | 525/285 |
| 4,401,793 | 8/1983 | Chiao et al. ......................... | 525/285 |
| 4,508,874 | 4/1985 | Hergenrother et al. ............. | 525/285 |
| 4,673,458 | 6/1987 | Ishikawa et al. .................... | 430/313 |
| 4,877,818 | 10/1989 | Emmons et al. .................... | 430/313 |

OTHER PUBLICATIONS

Chemical Abstracts, vol. 89, p. 7750r, Graft Copolymer Emulsions.

*Primary Examiner*—Charles L. Bowers, Jr.
*Assistant Examiner*—John S. Y. Chu
*Attorney, Agent, or Firm*—Bucknam and Archer

[57] ABSTRACT

A method of forming a photosetting film includes the steps of forming a photosensitive film containing (a) 100 parts by weight of a modified resin obtained by reacting an α,β-unsaturated monocarboxylic acid derivative having an alcoholic hydroxyl group represented by formula:

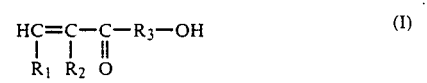

(wherein each of $R_1$ and $R_2$ independently represents a hydrogen atom or methyl and $R_3$ represents a hydrocarbon residue which may contain nitrogen or oxygen) with an α,β-unsaturated dicarboxylic acid anhydride adduct having a softening point (measured by a ring and ball softening point method of JIS K2531-60) of not less than 70° C. of a conjugated diene polymer or copolymer having a number-average molecular weight of 500 to 5,000, and a vinyl group content of not less than 50 mol % such that at least 10 mol % of an acid anhydride group of the adduct are ring-opened, and (b) 0.01 to 20 parts by weight of a photoinitiator on a conductive substance and exposing the photosensitive film to active light.

25 Claims, No Drawings

METHOD OF FORMING PHOTOSETTING FILM

BACKGROUND OF THE INVENTION

1. Field of the Invention

The present invention relates to a method of forming a photosensitive film consisting of a specific resin composition prepared by modifying a conjugated diene polymer or copolymer.

More specifically, the present invention relates to a method of manufacturing a printed circuit board using a photosensitive resin film containing a specific resin composition prepared by modifying a conjugated diene polymer or copolymer.

2. Description of the Prior Art

Although various printed circuit board manufacturing methods have been developed, a method using a photosetting resin as an etching resist or plating resist has been mainly used in recent years.

In the former method, a film consisting of a photosensitive resin composition is formed on a copper-clad substrate, and a negative circuit pattern mask is brought into tight contact with the resin film. Active light is then radiated to set a necessary portion of the photosensitive film, a non-set portion (an uncured portion) is removed by development, and etching is performed to obtain a predetermined circuit pattern.

In the latter method, a mask of a reverse pattern is used to remove a resin film on a necessary portion, and this portion is plated by solder as an etching-resistant protecting metal. A resin film on an unnecessary portion is removed, and etching is performed to obtain a predetermined circuit pattern In this case, the circuit pattern mask. corresponds to a negative of a photograph and is obtained by forming a light-shielding layer defining an arbitrary pattern on a transparent substrate. The substrate sometimes consists of glass but is mainly a plastic film of polyester or the like. A material of the light-shielding layer is a Cr-cross-linked organic film.

Conventionally, an acrylic resin composition is normally used as the photosensitive resin. The acrylic resin normally consists of, e.g., (1) a binder polymer, (2) a photopolymerizable monomer, (3) a photopolymerization initiator, and (4) other additives (a stabilizer, a colorant, and a flame-retarder).

The binder polymer is used to obtain a film-like shape and is mostly an acrylic resin. A molecular weight of the binder polymer is normally several tens of thousands. A monomer having an acryloyl group or methacryloyl group is used as the photopolymerizable monomer. These components are set or cross-linked and insolubilized upon exposure to active light.

A method of using a photosensitive resin composition using maleinized modified oil as a so-called photoresist such as an etching resist is described in, e.g., U.S. Pat. No. 3,954,587. However, the present inventors have found by a tack-free test that this composition is tacky at room temperature before exposure to light since a mixture of maleinized modified oil and a liquid ethylenic unsaturated compound having two or more unsaturated bonds in one molecule is used.

In order to manufacture a printed circuit board, a circuit pattern mask is normally vacuum-chucked to a formed photosensitive film and UV-exposed. If the photosensitive film is tacky, the film partially adheres on the circuit pattern mask, and the mask may be injured when it is removed. In order to prevent this, a cooling unit or cooling trough may be equipped with after the exposure unit. This is not preferable, however, since an installation cost is increased, and the number of manufacturing steps is also increased to result in a cumbersome operation. It is also undesirable to coat a releasant (a releasing agent) on a circuit pattern mask or a photosensitive resin film in terms of exposure properties. In addition, labor and the manufacturing cost are increased.

SUMMARY OF THE INVENTION

In order to solve the above problems, it is an object of the present invention to provide a photosensitive film having a tack-free property which does not pose a problem in at least the manufacture of a printed circuit board.

That is, the present invention relates to a method of forming a photosetting film, comprising the steps of forming a photosensitive film containing (a) 100 parts by weight of a modified resin obtained by reacting an $\alpha,\beta$-unsaturated monocarboxylic acid derivative having an alcoholic hydroxyl group represented by formula:

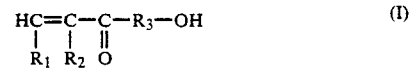

(wherein each of $R_1$ and $R_2$ independently represents a hydrogen atom or methyl and $R_3$ represents a hydrocarbon residue which may contain nitrogen or oxygen) with an $\alpha,\beta$-unsaturated dicarboxylic acid anhydride adduct having a softening point (measured by a ring and ball softening point method of JIS K2531-60) of not less than 70° C. of a conjugated diene polymer or copolymer having a number-average molecular weight of 500 to 5,000, and a vinyl group content of not less than 50 mol % such that at least 10 mol % of an acid anhydride group of the adduct are ring-opened, and (b) 0.01 to 20 parts by weight of a photoinitiator on a conductive substance and exposing the photosensitive film to active light to set or cure the photosensitive composition.

More specifically, the present invention relates to a method of forming a photosetting film, comprising the steps of forming a photosensitive film containing (a) 100 parts by weight of a modified resin obtained by reacting an $\alpha,\beta$-unsaturated monocarboxylic acid derivative having an alcoholic hydroxyl group represented by formula:

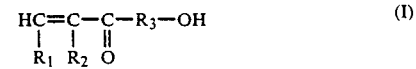

(wherein each of $R_1$ and $R_2$ independently represents a hydrogen atom or methyl and $R_3$ represents a hydrocarbon residue which may contain nitrogen or oxygen) with an $\alpha,\beta$-unsaturated dicarboxylic acid anhydride adduct having a softening point (measured by a ring and ball softening point method of JIS K2531-60) of not less than 70° C. of a conjugated diene polymer or copolymer having a number-average molecular weight of 500 to 5,000, and a vinyl group content of not less than 50 mol % such that at least 10 mol % of an acid anhydride group of the adduct are ring-opened, and (b) 0.01 to 20 parts by weight of a photoinitiator on a copper-clad laminate, bringing a pattern film into tight contact with the photosensitive film to perform exposure to active light, and removing an unnecessary portion of the photosensitive film by development.

DETAILED DESCRIPTION OF THE PREFERRED EMBODIMENTS

A conjugated diene polymer or copolymer having a number-average molecular weight of 500 to 5,000 has a large number of double bonds in a molecule and high reactivity and therefore can be variously modified. For this reason, it is easy to introduce a photopolymerizable double bond by modification, but the obtained modified product is normally in a liquid phase or viscous at normal temperature.

The present inventors have found, however, that a photosensitive resin film, formed by a modified resin manufactured by adding a large amount of an $\alpha,\beta$-unsaturated dicarboxylic acid anyhydride to a conjugated diene polymer or conjugated diene copolymer to obtain an addition product (adduct) having a softening point (measured by a ring and fall softening point method of JIS-K-2531-60) OF 70° C. or more and partially or entirely ring-opening the addition product with an, $\alpha,\beta$-unsaturated monocarboxylic acid derivative having an alcoholic hydroxyl group to introduce a conjugated double bond, is not tacky at room temperature in a finger-tack test.

This modified resin has (1) a good development property because the number-average molecular weight of the material resin is relatively small, about 500 to 5,000 and (2) a good photosetting property because the resin contains a large number of photopolymerizable vinyl bonds and conjugated double bonds in a molecule.

Therefore, the resin composition of the present invention is a photosensitive resist resin composition having good properties for manufacturing a printed circuit board and can be suitably used as an etching resist or solder resist.

That is, the present inventors have first found that unless the softening point of a conjugated diene polymer or copolymer to which an $\alpha,\beta$-unsaturated dicarboxylic acid anhydride is added is considerably high, 70° C. or more, the modified resin obtained by modifying this polymer or copolymer with an $\alpha,\beta$-unsaturated monocarboxylic acid derivative having an alcoholic hydroxyl group cannot have tack-free property. Normally, since a polar group is introduced upon modification, a correlation at a softening point before and after modification is not necessarily clear. In addition, the softening point and a tack-free property do not always correlate with each other. Therefore, it is surprising that a cold tack property of a photosensitive film can be controlled by a softening point of the intermediate resin.

Examples of the conjugated diene polymer or copolymer as a material resin are a low molecular weight polymer of the conjugated diolefin having 4 to 5 carbon atoms such as butadiene and isoprene, and a low molecular weight copolymer of one or more types of the conjugated diolefin and a monomer having an ethylenic unsaturated double bond other than the conjugated diolefin, e.g., an aliphatic or aromatic monomer such as isobutylene, diisobutylene, styrene, $\alpha$-methylstyrene, and vinyltoluene. In addition, a mixture of two or more types of the above monomer can be used.

The above conjugated diene polymer or copolymer has a mean number molecular weight of 500 to 5,000 with a vinyl group content of 50 mol % or more. The polymer or copolymer having a vinyl group content of less than 50 mol % is not preferable because its crosslinking density of the photosetting film is small. If the molecular weight is less than 500, film strength obtained after photosetting is low. If the molecular weight exceeds 5,000, a smooth film cannot be obtained. Therefore, neither of these polymers or copolymers are preferable. Those polymer or copolymer are usually liquid or viscous liquid.

These low molecular weight polymers can be manufactured by a known conventional method. That is, in a typical manufacturing method, an alkali metal or organic alkali metal compound is used as a catalyst, and a conjugated diolefin having 4 to 5 carbon atoms, a mixture of such diolefin having 4 to 5 carbon atoms, a mixture of such diolefins, or preferably 50 mol % or less of an aromatic vinyl monomer, e.g., styrene, $\alpha$-methylstyrene, vinyltoluene or divinylbenzene with respect to the conjugated diolefin is anion-polymerized at a temperature of 0° C. to 100° C. In this case, in order to obtain a light-color low polymer having a low gel content by controlling a molecular weight, preferable manufacturing methods are a chain transfer polymerization method (U.S. Pat. No. 3,789,090) in which an organic alkali metal compound such as benzyl sodium is used as a catalyst, and a compound having an alkylaryl group such as toluene is used as a chain transfer agent, a living polymerization method (Japanese Patent Publication Nos. 42-17485 and 43-27432) in which a polycyclic aromatic compound such as naphthalene is used as an activator and an alkali metal such as sodium is used as a catalyst in a tetrahydrofuran solvent, Japanese Patent Publication No. 42-17485 describes a method of manufacturing a living polymer and a polymer derived from the living polymer according to which a mixed liquid is prepared by mixing an alkali metal and an activating agent in an amount less than the stoichiometric amount relative to the alkali metal in the presence of a Lewis base type compound, so as to contain a little amount of the activating agent-alkali metal complex and a large amount of unreacted alkali metal in the mixture, and then a monomer is added to the mixture.

Japanese Patent Publication No. 43-27432 consists of manufacturing a polybutadiene or butadiene copolymer accompanying or not accompanying a functional group at its one or both terminals and having a polymerization degree of 2 or more by adding butadiene to a solution of an activating agent/alkali metal complex prepared from a Lewis base, an activating agent and an alkali metal or to a mixed solution of said complex and alkali metal. Butadiene and a monomer having a polar factor having a value of −1.2 to −0.8 may be simultaneously or sequentially added to a solution of an activating agent-/alkali metal or to a mixed solution of the complex and alkali metal, so as to produce a living butadiene copolymer, which is characterized in that BB fraction, a crude raw material of butadiene, is employed as it is in place of butadiene at a reaction temperature of 30° C. or less, so as to cause butadiene in the BB fraction to be selectively polymerized, and then the resultant product is treated with a reagent which is capable of reacting with a carbon-alkali metal bond. a polymerization method (Japanese Patent Publication Nos. 32-7446, 33-1245, and 31-10188) in which an aromatic hydrocarbon such as toluene or xylene is used as a solvent, a dispersion of a metal such as sodium is used as a catalyst, and an ether such as dioxane is added to control a molecular weight. Specifically Japanese Patent Publication No. 32-7446 described a method of manufacturing a synthesized drying oil, which comprises the steps of decomposing petroleum fraction in the presence of steam, separating the $C_4$ fraction from the resulting decomposed fraction, and polymerizing the $C_4$ fraction in the presence of an alkali metal catalyst and a lower aliphatic ether of cyclic ether so as to produce a colorless drying oil.

The method of Japanese Patent Publication No. 33-1245 consists of continuously manufacturing a hydrocarbon drying oil by copolymerizing butadiene or an homologue and styrene or an alkylated styrene in the presence of an inert hydrocarbon solvent and an alkali metal catalyst to continuously produce a polymerized hydrocarbon drying oil. The copolymerization is effected in the presence of one to 100 parts based on 100 parts of monomer of an accelerator selected from the group consisting of alkylethers having 4 to 8 carbon atoms and cyclic diethers having oxygen atom separated by at least two carbon atoms. The first step of the copolymerization is finalized at a temperature of 40° to 75° C., and the subsequent step or steps of the copolymerization are performed at a temperature ranging from 55° to 105° C., with any subsequent polymerization step being performed at a temperature which is the same as or higher than that of the preceding polymerization step. In addition, a low polymer (Japanese Patent Publication Nos. 45-507 and 46-30300) manufactured by coordinate anion polymerization using an acetyl acetonate compound of a Group VIII metal of the Periodic Table, e.g., cobalt or nickel and alkylaluminumhalogenide as catalysts can be used. Specifically, Japanese Patent Publication No. 45-507 describes a method of manufacturing a low molecular, low viscosity butadiene-diolefin copolymer having a number of intermediate double bonds which consists of copolymerizing butadiene and a conjugated diolefin having 4 or more carbon atoms in a molar ratio of 1:3 to 1:0.1 in the presence of a mixed catalyst comprising alkylaluminum halogenide represented by a general formula;

$R_nAlX_{(3-n)}$ in which R is hydrogen atom, alkyl-, aryl- or alkylaryl-residual group having 1-12 carbon atoms, X is halogen, and n is a number ranging from 0.5 to 2.5 and a soluble nickel compound; the amount of the nickel compound being 0.001-0.25 mol, preferably 0.01-0.25 mol per one mol of aluminum compound in an inert diluent.

In the method of Japanese Patent Publication No. 46-30300, a low molecular unsaturated liquid polymer having double bond mainly in an intermediate portion thereof, a viscosity of 50–30,000 c.p. (50° C.), low molecular liquid polybutadiene, low molecular butadiene/-diene- and low molecular butadiene/styrol-comonomer, is polymerized or copolymerized in the presence of a nickel compound which is soluble in a diluent and an alkylaluminum halogenide represented by the formula:

$R_nAlX_{(3-n)}$ in which R is hydrogen atom, alkyl-, aryl- or alkylaryl-residual group having 1-12 carbon atoms, X is halogen, and n is a number ranging from 0.5 to 2.5. The reaction is carried out in the presence of a compound selected from the group consisting of ammonia, amine, a heterocyclic nitrogen compound, an azo- and hydrazo-compound, and ether, and this compound is added to the reaction system after the initiation of the reaction between the nickel compound and the alkylaluminum halogenide.

In addition, in the present invention, an adduct of an acid anhydride group is prepared by adding an $\alpha,\beta$-unsaturated dicarboxylic acid anhydride to a conjugated diene polymer of conjugated diene copolymer.

In the present invention, examples of the $\alpha,\beta$-unsaturated dicarboxylic acid anhydride are acid anhydride such as maleic anhydride, citraconic anhydride, and chloromaleic anhydride.

This addition reaction is normally performed in an inactive solvent dissolving one or both of the above substance at a reaction temperature of 100° C. to 250° C. During this reaction, 0.1 to 0.3 parts by weight of hydroquinone, a catechol, a p-phenylenediamine derivative, or the like are added as an anti-gelling agent.

In the present invention, it is important to add the $\alpha,\beta$-unsaturated dicarboxylic acid anhydride so that the softening point (measured by the ring and ball softening point method) of the resultant adduct of the acid anhydride becomes 70° C. or more. This softening point mainly depends on the content of unsaturated bonds and the molecular weight of the conjugated diene polymer or copolymer and the addition amount of the $\alpha,\beta$-unsaturated dicarboxylic acid anhydride. For example, when a liquid butadiene polymer having a number-average molecular weight of 1,000 is used, the total acid value of a modified product must be 400 or more.

The upper limit of the softening point of the adduct is not particularly limited but is suitably 200° C. or less.

A softening point exceeding 200° C. is not preferable because a smooth coating surface after exposure cannot be obtained.

In the present invention, the adduct of the anhydride obtained as described above is reacted with an $\alpha,\beta$-unsaturated monocarboxylic acid derivative having an alcoholic hydroxyl group represented by formula (I), so as to obtain the modified resin described in item (a) in which at least 10% of the acid anhydride group are ring-opened.

The monocarboxylic acid derivative represented by formula (I) is an acid amide or an ester of acrylic acid or methacrylic acid. That is, the derivative is an ester of a diol such as ethylene glycol and propylene glycol or an amide of a hydroxy-group-containing primary amine such as methylol amine.

Therefore, $R_3$ in formula (I) represents a divalent group derived from a hydrocarbon preferably having six or less carbon atoms such as ethane or propane or a divalent group derived from a primary alkyl amine preferably having six or less carbon atoms such as a methylamine or ethylamine.

More specifically, examples of acid derivative represented by formula (I) are 2-hydroxyethylacrylate, 2-hydroxypropylacrylate, 2-hydroxyethylmethacrylate, 2-hydroxypropylmethacrylate, and N-methylolacrylamide. These derivatives can be used singly or in a combination of two or more thereof.

A ring-opening reaction of an acid anhydride group using the above derivatives is normally performed in the presence of basic catalyst at a comparatively low temperature, 100° C. or less. In this case, the ring-opening reaction need not be completely performed but can be performed such that, e.g., 50% of the acid anhydride group are ring-opened and the remaining acid anhydride group is ring-opened with alcohol or water not having an unsaturated group. In addition, an imidized primary-amine-containing compound may be used. In this reaction, a solvent not having reactivity with respect to the two substances and capable of dissolving both of them is preferably used. Examples of such a solvent are aromatic hydrocarbons such as toluene and xylene, ketones such as methylethylketone and methylisobutylketone, esters such as ethyl acetate, others not having a hydroxyl group such as diethylenegylcoldimethylether, and tertiary alcohols such as diacetonealcohol.

In any case, the ratio to be ring-opened by an $\alpha,\beta$-unsaturated monocarboxylic ester having an alcoholic hydroxyl group is preferably 10 mol % or more, and more preferably, 30 mol % or more of the acid anhydride group of the maleinized resin in terms of a photosetting property. In this manner, the modified resin of item (a) above is manufactured.

Examples of a photoinitiator described in item (b) may be conventional photopolymerization initiators such as benzoin, benzoinmethylether, benzoinethylether, benzoinisobutylether, benzyl, and Michler's ketone and those available under tradenames of Irgacure 184 (Ciba Geigy Co.), Irgacure 651 (Ciba Geigy Co.), and Darocure 1173 (Merck & Co., Inc.) An amount of the photoinitiator is 0.01 to 20 parts by weight, and preferably 0.1 to 10 parts by weight with respect to 100 parts by weight of a modified conjugated diene polymer or copolymer. If the amount of the photoinitiator is smaller than 0.01 parts by weight, the photosetting property is degraded If the amount of the photoinitiator is larger than 20 parts by weight, the strength of the obtained photosensitive film is degraded.

The modified resin of item (a) and the photoinitiator of item (b) are diluted in an organic solvent and coated and dried on a conductive substance; neutralized by a base, dissolved or dispersed in water, and then coated normally by an applicator; or electrodeposited on a conductive substance by an electrodeposition method, thereby forming a photosensitive film on the conductive substance.

The photosensitive film of the present invention can contain as a heat polymerization stabilizer hydroquinone, 2,6-di-tert.-butylparacresol, parabenzoquinone, hydroquinonemonomethylether, phenothiazine, or $\alpha$-naphthylamine.

Other arbitrary additives can be added as long as a tack is not caused on the film after exposure. Examples of the additives are conventional photopolymerizable monomers such as 2-ethylhexylacrylate, 2-hydroxyethylacrylate, 1,3-butanediolacrylate, trimethylolpropanetriacrylate, pentaerythritoltriacrylate, 2-ethylhexylmethacrylate, 2-hydroxyethylmethacrylate, 1,3-butanediolmethacrylate, trimethylolpropanetrimethacrylate, pentaerythritoltrimethacrylate, and high-melting point tri(acryloyloxyethyl)isocyanurate.

Examples of the organic solvent used for dilution and coated and dried on a conductive substance are water-soluble organic solvents such as ethylcellusolve, butylcellusolve, ehtyleneglycoldimethylether, diacetonealcohol, 4-methoxy-4-methylpentanone-2, and methylethylketone and non-aqueous organic solvents such as xylene, toluene, methylisobutylketone, and 2-ethylhexanol. However, the solvent is not particularly limited to those enumerated above but may be any solvent as long as it can homogeneously dissolve the resin composition.

As the method of coating the dispersions or solutions on the conductive substance, dip coating, roll coating, and curtain coating can be used.

Dissolution or dispersion in water is performed after the modified resin of (a) as conjugated diene polymer or copolymer modified as described above and the photoinitiator of (b) are mixed and normally 10mol % or more of the acid radical of the modified conjugated diene polymer or copolymer are neutralized by a normal basic compound. If the neutralization amount is less than 10 mol %, neutralization is insufficient, and dissolution or dispersion property in water becomes poor. Therefore, the obtained film is not preferable as an aqueous paint.

Examples of the base for use in neutralization are conventional neutralizing agents such as ammonia, amines, e.g., diethylamine, triethylamine, monoethanolamine, diethanolamine, N,N-dimethylethanolamine, and N,N-dimethylbenzylamine, and potassium hydroxide. For the purpose of improving the dissolution or dispersion property in water or to adjust flowability of the film, various organic solvents can be used if necessary. Examples of the organic solvent are water-soluble organic solvents such as ethylcellusolve, butylcellusolve, ehtyleneglycoldiethylether, diacetonealcohol, 4-methoxy-4-methylpentanone-2, methylethylketone and non-aqueous organic solvents such as xylene, toluene, methylisobutylketone, and 2-ethylhexanol.

Similar to the method of diluting in an organic solvent and coating, the above aqueous solution or dispersion may be coated on the conductive substance by dip coating, roll coating, or curtain coating.

Electrodeposition can be performed by a conventional method as follows. That is, an electrodeposition bath of a water solution or water dispersion containing a water-soluble or water-despersible photosensitive resin composition is controlled under conditions that a pH is 5.0 to 9.0, a concentration of the photosetting resin composition is 5 to 20 wt %, and a bath temperature is 15° C. to 40° C. A conductive substance is dipped as an anode in this bath, and a DC current is supplied at 40 to 400 V by using the electrodeposition bath as a cathode. As a result, the photosensitive resin composition precipitates on a copper metal layer of a substrate to form a photosensitive film. The electrocoated conductive substance is removed from the electrodeposition bath and washed. Thereafter, water contained in the electrodeposited film is dried out and removed to form a photosensitive film by the electrodeposition method of which film is tack-free.

As the conductive substance of the present invention, an arbitrary conductive substance such as a metal, e.g., copper or iron can be used.

A typical conductive substance for use in the method of the present invention is a copper metal layer such as a copper-clad laminate which is a substrate on which a copper metal layer is formed.

In the present invention, it is preferable to form a photosensitive film for forming a circuit pattern on a copper-clad laminate by the electrodeposition method of the present invention.

That is, when a film is formed by the above electrodeposition method, a sharp portion of the laminate and an interior of a so-called through-hole in the copper-clad laminate can be sufficiently coated because throwing power is good. Therefore, this electrodeposition method is preferable in the present invention.

As described above, the compositions are diluted in an organic solvent and then coated, or a water dispersion or water solution obtained by dispersing or dissolving the composition in water with neutralization is coated or electrodeposited and then dried, thereby forming a photosensitive film which is tack-free.

This drying is performed at normally 120° C., and preferably, 100° C. or less for 10 to 20 minutes. A temperature of more than 120° C. is not preferable because the film is thermoset.

The film obtained as described above is free from a tack at normal temperature and has a smooth coating surface. Therefore, this film is optimal as a photosensitive film for manufacturing a circuit pattern in a copper-clad laminate.

The present invention will be described in more detail below with reference to an embodiment in which the method of the present invention is applied to a copper-clad laminate.

Ultraviolet lights are exposed through a circuit pattern mask as a negative mask on a photosensitive film coated on a copper-clad laminate to set the exposed portions of the photosensitive film. Thereafter, development is performed by using a suitable developing agent to elute non-exposed portions, thereby exposing the copper layer. The exposed copper layer is removed by an etchant, and then the set film is removed by a suitable releasant (a chemical stripper), thereby completing a wiring pattern with very high resolution.

Exposure to active light to photoset the photosensitive film can be performed by a conventional method. For example, a mercury-vapor lamp is used as a UV-light source to perform exposure through a circuit pattern mask having a desired image. It is a matter of course that scanning exposure can be performed by a beam with a small diameter, e.g., and argon laser beam.

In order to improve an etching resistance after development, additional UV radiation or postcure of a residual film at a temperature exceeding 120° C. may be performed.

In the present invention, the type of light for use in exposure depends on an absorption wavelength of the photopolymerization initiator. Normally, however, light having a wavelength of 3,000 to 4,500 Å is preferable. Examples of a light source are a sunlight, a mercury-vapor lamp, a xenon lamp, an arc lamp, and an argon laser described above A film can be set within a few minutes upon exposure.

An industrial printed circuit board having a fine circuit pattern is normally manufactured by using a copper-clad laminate as a material in accordance with a photograph method called a subtractive method using a photosensitive resin. This method is classified into a panel plating method of forming a cured resin on a circuit portion and a pattern plating method of forming a cured resin on a non-circuit portion.

In the panel plating method, a cured resin film is formed on a circuit portion of a substrate. When the substrate has a through hole, ink filling or tenting is performed for the through hole. A non-circuit portion is removed by etching to form a wiring circuit. In this case, the photosetting resin is called an etching resist. In the pattern plating method, a cured resin film is formed on a non-circuit portion, and a protecting metal (normally, a solder is used) having an etching resistance is formed on a portion without the resin film. Thereafter, the resin film is removed, and the exposed metal portion is etched. In this case, the photosetting resin is called a plating resist.

Of these methods, the panel plating method is inexpensive because manufacturing steps are simple. However, reliability of the through hole is poor. The pattern plating method has opposite characteristics to the panel plating method.

In the method of the present invention, a film obtained from the photosensitive resin composition have a tack-free property after it is dried and has good resolution upon exposure, and its film thickness can be arbitrarily adjusted. Therefore, either the panel or pattern plating method can be applied in the manufacture of a printed circuit board.

According to the method of the present invention, a photosensitive film free from a tack property can be manufactured. In addition, a modified resin used in the film is an inexpensive photosensitive resin with high resolution. Therefore, the method of the present invention is suitable as a method of manufacturing a printed circuit board.

The present invention will be described in more detail below by way of its examples. However, the present invention is not limited to the following examples.

Example 1

322 g of a 1,2-bond-65% liquid butadiene polymer having a number-average molecular weight of 1,000 and a viscosity of 14 poise at 25° C. and prepared by polymerizing butadiene in the presence of a chain transfer agent, toluene at 30° C. by using benzyl sodium as a catalyst, 178.8 g of maleic anhydride, 10 g of xylene, and 1.1 g of Antigen 6C (tradename) (a polymerization inhibitor available from SUMITOMO CHEMICAL CO., LTD.) were put into a 1-l separable flask having a reflux condensing tube and a nitrogen blowing tube, and reacted under a nitrogen flow at 190° C. for 4.5 hours. Non-reacted maleic anhydride and xylene were distilled off to synthesize a maleic butadiene polymer having a total value of 400 mg KOH/g. A softening point (ring and ball softening point JIS-K-2531-60) of this polymer was 89° C.

200 g of the obtained maleic butadiene polymer, 400 g of diacetone alcohol, and 0.2 g of hydroquinone were put into a 1l separable flask having a reflux condensing tube and dipped in an oil bath at 80° C. The materials in the flask were lightly stirred to completely dissolve the maleic butadiene polymer.

82.7 g of 2-hydroxyethylacrylate and 10 g of triethylamine were added to the resultant mixture, and the mixture was strongly stirred. The temperature of the oil bath was adjusted to decrease the temperature in the flask to 40° C., 6 g of benzoisobutylether were added, and the mixture was stirred for 20 minutes A content of a nonvolatile component of the resultant composition was 40%.

The above water dispersion was coated by an applicator on a brushed, washed, and degreased copper-clad laminate and dried at 80° C. for 20 minutes, thereby obtaining a film having a thickness of 10. When this film was touched with a finger at room temperature, no tack was found.

A negative circuit pattern mask consisting of a polyester base material having a pattern with a maximum thickness of 30 μ was brought into tight contact with the above film, a 1.5-mm thick crystal glass was placed thereon, and exposure was performed by a UV exposure apparatus (high-pressure mercury-vapor lamp illumination apparatus UVC-2513 (tradename) available from USHIO INC.) with a 365-nm, exposure amount of 400 mJ/cm$^2$. During this exposure, the temperature was increased to 32° C., but the mask in contact with the film could be easily removed therefrom after exposure.

Development was performed by using 2% Na$_2$CO$_3$ aqueous solution. The film was then postcured in an electric furnace at 120° C. for 10 minutes.

Etching was performed by using a ferric chloride solution (Baume 40 (tradename) available from TSURUMI SODA CO., LTD.), and removal of a cured film was performed by a 5% caustic soda solution. As a result, a printed circuit board having a line with a maximum width of 30 μ was obtained.

Example 2

286 g of liquid butadiene polymer prepared in Example 1, 214 g of maleic anhydride, 10 g of xylene, and 1.1 g of Antigen 6C (tradename, available from SUMITOMO CHEMICAL CO., LTD.) were put into a 1l separable flask having a reflux condensing tube and a nitrogen blowing tube and reacted under a nitrogen flow at 190° C. for 4.5 hours. Non-reacted maleic anhydride and xylene were removed to synthesize a maleic butadiene polymer having a total acid value of 480 mg KOH/g. A softening point of this polymer was 128° C.

200 g of the obtained maleic butadiene polymer, 200 g of diacetone alcohol, and 0.2 g of hydroquinone were put into a 1-l separable flask having a reflux condensing tube, dipped in an oil bath at 80° C., and the materials in the flask were lightly stirred to completely dissolve the maleic butadiene polymer.

99.3 g of 2-hydroxyethylacrylate and 12 g of triethylamine were added and the mixture in the flask was strongly stirred for 20 minutes. The temperature of the oil bath was adjusted to decrease the temperature in the flask to 40° C. 6 g of benzoinisobutylether, 20 g of trimethylolpropanetriacrylate, and 14 g of triethylamine were added and stirred for 20 minutes. The oil bath was removed, and 1,466 g of pure water were gradually dropped while the mixture was strongly stirred, thereby preparing a white water dispersion. This water dispersion had a pH of 5.3, conductivity of 1.53 mS, and a nonvolatile component content of 16%.

A copper-clad laminate treated following the same procedures as in Example 1 was connected to an anode and subjected to electrodeposition by using the above water dispersion under the following conditions, thereby forming a photosensitive resin film.

Anion Electrodeposition

Constant Voltage application voltage: 40 Volt
Method application time: 3 minutes (boosting, 30 seconds)

After electrodeposition, drying was performed at 80° C. for 10 minutes, thereby obtaining a 10-μ thick film free from a tack at normal temperature in a finger-tack test.

By using this film, exposure, development, postcure, etching, and removal were performed following the same procedures as in Example 1. As a result, the mask could be easily removed as in Example 1, and a printed circuit board having a line with a maximum width of 30 μ was obtained.

Example 3

200 g of a maleic butadiene polymer prepared in Example 2, 400 g of diacetone alcohol, and 0.2 g of hydroquinone were put into a 1l separable flask having a reflux condensing tube, dipped in an oil bath at 80° C., and the mixture in the flask was lightly stirred to completely dissolve the maleic butadiene polymer.

49.6 g of 20-hydroxyethylacrylate, 13.7 g of methanol, and 12 g of triethylamine were added, and the mixture in the flask was strongly stirred for 20 minutes. The temperature in the flask was decreased to 40° C., and 6 g of Irgacure 651 (tradename, available from Japan Ciba Geigy Co.) were added and stirred for 20 minutes. A nonvolatile component content of this composition was 40%.

This composition was coated by an applicator on a copper-clad laminate treated following the same procedures as in Example 1 and dried at 80° C. for 20 minutes, thereby forming a 10-μ thick photosensitive film free from a cold tack property on the copper-clad substrate.

By using this film, exposure, development, postcure, etching, and removal were performed following the same procedures as in Example 1. As a result, the mask could be easily removed as in Example 1. In addition, a printed circuit board having a line with a maximum width of 30 μ was obtained.

Comparative Example 1

357 g of a liquid butadiene polymer prepared in Example 1, 143 g of maleic anhydride, 10 g of xylene, and 1.1 g of Antigen 6C (tradename, available from SUMITOMO CHEMICAL CO., LTD.) were put into a 1-l separable flask having a reflux condensing tube and a nitrogen blowing tube and reacted under a nitrogen flow at 190° C. for 4.5 hours. Non-reacted maleic anhydride and xylene were removed to synthesize a maleic butadiene polymer having a total acid value of 320 mg KOH/g. a softening point of the polymer was 64° C.

200 g of the obtained maleic butadiene polymer, 400 g of diacetone alcohol, and 0.2 g of hydroquinone were put into a 1-l separable flask having a reflux condensing tube, dipped in an oil bath at 80° C., and the mixture in the flask was lightly stirred to completely dissolve the maleic butadiene polymer.

66.2 g of 2-hydroxyethylacrylate and 10 g of triethylene were added, and the mixture in the flask was strongly stirred for 20 minutes. The temperature of the oil bath was adjusted to decrease the temperature in the flask to 40° C., and 6 g of benzoinisobutylether were added and stirred for 20 minutes. A nonvolatile component content of the resultant composition was 38%.

This above water dispersion was coated by an applicator on a copper-clad laminate which was brushed, washed and degreased following the same procedures as in Example 1, and dried at 80° C. for 20 minutes to remove remaining water, thereby obtaining a smooth film. When this film was touched with a finger at room temperature, a tack was apparently found.

Following the same procedures as in Example 1, a circuit pattern mask was brought into contact with the film and exposed. Thereafter, when the mask was removed, the film partially adhered on the mask.

What is claimed is:

1. The method of manufacturing a printed circuit board which comprises:
   a) reacting an α,β-unsaturated dicarboxylic acid anhydride with a conjugated diene polymer or copolymer having a number-average molecular weight of 500 to 5,000 and a vinyl group content or not less than 50 mol % whereby an adduct is obtained, said adduct having a softening point method of JIS K2531-60 not less than 70° C.;

b) reacting said adduct from step a) with an $\alpha,\beta$-unsaturated monocarboxylic acid derivative having an alcoholic hydroxyl group of formula:

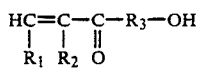

wherein each of $R_1$ and $R_2$ independently is a hydrogen atom or methyl and $R_3$ is a hydrocarbon residue which is unsubstituted or substituted by nitrogen or oxygen whereby a modified resin is obtained having at least 10% of the acid ring anhydride group open;

c) preparing a non-tacky photosensitive film comprising 100 parts by weight of said modified resin from step b) and 0.01 to 20 parts by weight of a photoinitiator on a copper clad laminate whereby said photosensitive film is formed on said copper-clad laminate;

d) contacting said photosensitive film with a circuit pattern mask and e) exposing said photosensitive film through said circuit pattern mask to active light to photoset said photosensitive film and an uncured portion of said photosensitive film is removed by development so as to manufacture a printed circuit board.

2. A method of manufacturing a photosetting film which comprises the steps of:

a) reacting an $\alpha,\beta$-unsaturated dicarboxylic acid anhydride with a conjugated diene polymer or copolymer having a number-average molecular weight of 500 to 5,000 and a vinyl group content of not less than 50 mol % whereby an adduct is obtained, said adduct having a softening point measured by the ring and ball softening point method JIS K2531-60 not less than 70° C.;

b) reacting said adduct from step a) with an $\alpha,\beta$-unsaturated monocarboxylic acid derivative having an alcoholic hydroxyl group of formula:

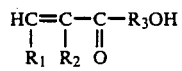

wherein each of $R_1$ and $R_2$ independently is a hydrogen atom or methyl and $R_3$ is a hydrocarbon residue which is unsubstituted or substituted by nitrogen or oxygen atoms whereby a modified resin is obtained having at least 10% of the acid ring anhydride group open;

c) preparing a non-tacky photosensitive film comprising 100 parts of said modified resin from step b) and 0.01 to 20 parts by weight of a photoinitiator on a conductive substance and d) exposing said photosensitive film from step c) through a mask to active light to set or cure said photosensitive film to obtain a photosetting film on said conductive substance in which the exposed portion of the photosensitive film is set.

3. A method of manufacturing a tack-free photosensitive film on a substrate which comprises the steps of a) reacting an $\alpha,\beta$-unsaturated dicarboxylic acid anhydride with a conjugated diene polymer or copolymer having a number-average molecular weight of 500 to 5,000 and a vinyl group content of not less than 50 mol % whereby an adduct is obtained, said adduct having a softening point method of JIS K2531-60 not less than 70° C.;

b) reacting said adduct from step a) with an unsaturated monocarboxylic acid derivative having an alcoholic hydroxyl group of formula:

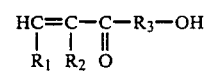

wherein each of $R_1$ and $R_2$ independently is a hydrogen atom or methyl and $R_3$ is a hydrocarbon residue which is unsubstituted or substituted by nitrogen or oxygen atoms whereby a modified resin is obtained having at least 10% of the acid ring anhydride group open;

c) preparing said tack-free photosensitive film comprising 100 parts by weight of said modified resin from step b) and 0.01 to 20 parts by weight of a photoinitiator on said substrate.

4. The method according to claim 1, further comprising the steps of performing etching to remove an unnecessary portion of copper and removing the remaining photosetting film by a removing agent.

5. A method according to claim 1 further comprising the steps of performing solder plating having an etching resistance, removing the remaining photosensitive film and performing etching to remove an unnecessary portion of copper.

6. The method according to claim 1 wherein said circuit pattern mask is made of a polyester, development is carried out by means of an aqueous sodium carbonate solution and etching is carried out by means of a ferric chloride.

7. The method according to claim 2 wherein the softening point of said adduct in step a) is up to 200° C.

8. The method according to claim 2, wherein said $\alpha,\beta$-unsaturated dicarboxylic acid anhydride is maleic anhydride, citraconic anhydride or chloromaleic anhydride.

9. The method according to claim 2, wherein said $\alpha,\beta$-unsaturated monocarboxylic said derivatives in step b) is a member selected from the group consisting of 2-hydroxyethylacrylate, 2-hydroxypropylacrylate, 2-hydroxyethylmethacrylate, 2-hydroxypropylmethacrylate, and N-methylolacrylamide.

10. The method according to claim 2, wherein said conjugated diene in step a) is butadiene and the ring of said anhydride in step c) is open up to the extent of 30%.

11. The method according to claim 2, wherein said conjugated diene polymer or copolymer is prepared by polymerization or copolymerization of at least one member selected from the group consisting of isobutylene diisobutylene, styrene $\alpha$-methylstyrene and vinyl toluene.

12. The method according to claim 2 wherein said adduct in step a) is prepared at a temperature of 100° C.-250° C.

13. The method according to claim 2 wherein said photosensitive film in step c) is formed by diluting said modified resin from step b) and said photoinitiator in an organic solvent to obtain a solution, coating substrate with said solution and then drying to obtain a photosensitive film on said substrate.

14. The method according to claim 2 wherein said photosensitive film is formed by dispersing or dissolving said modified resin and said photoinitiator in water by neutralization with a base to obtain a dispersion or solution and then coating said substrate.

15. The method according to claim 2 wherein said substrate is a conductive substance and said photosensitive film is formed by dispersing or dissolving said modified resin from step b) and said photoinitiator in water by neutralization with a base and electrodepositing said obtained dispersion or solution on said conductive substance by an electrodeposition method and drying to obtain a non-tacky photosensitive film.

16. The method according to claim 2 wherein said photosensitive film in step c) is formed by coating said substrate by dip coating, roll coating or curtain coating.

17. The method according to claim 2 wherein said substrate in step c) is copper or iron.

18. The method according to claim 3 wherein said adduct in step a) has a softening point up to 200° C.

19. The method according to claim 3, wherein said α,β-unsaturated dicarboxylic acid anhydride is maleic anhydride, citraconic anhydride or chloromaleic anhydride.

20. The method according to claim 3, wherein said α,β-unsaturated monocarboxylic acid derivative in step b) is a member selected from the group consisting of 2-hydroxyethylacrylate, 2-hydroxypropylacrylate, 2-hydroxyethylmethacrylate, 2-hydroxypropylmethacrylate, and N-methylolacrylamide.

21. The method according to claim 3, wherein said conjugated diene in step a) is butadiene and the ring of said anhydride in step c) is open up to the extent of 30%.

22. The method according to claim 3, wherein said conjugated diene polymer of copolymer is prepared by polymerization or copolymerization of at least one member selected from the group consisting of isobutylene, diisobutylene, styrene, α-methylstyrene and vinyl toluene.

23. The method according to claim 3 wherein said adduct in step a) is prepared at a temperature of 100° C.-250° C.

24. The method according to claim 3 wherein said photosensitive film in step c) is formed by diluting said modified resin from step b) and said photoinitiator in an organic solvent to obtain a solution, coating a substrate with said solution and then drying to obtain a photosensitive film on said substrate.

25. The method according to claim 3 wherein said photosensitive film is formed by dispersing or dissolving said modified resin and said photoinitiator in water by neutralization with a base to obtain a dispersion or solution and then coating said substrate.

* * * * *